(12) United States Patent
Malkowski, Jr. et al.

(10) Patent No.: US 7,510,223 B2
(45) Date of Patent: Mar. 31, 2009

(54) ARC RESISTANT ELECTRICAL ENCLOSURE SYSTEM AND METHOD

(75) Inventors: Chester Malkowski, Jr., Franklin, WI (US); G. Erich Heberlein, Jr., Everett, WA (US); James Hunter Meriwether, Muscoda, WI (US); Eric Krieg, Cedarburg, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 280 days.

(21) Appl. No.: 11/249,960

(22) Filed: Oct. 13, 2005

(65) Prior Publication Data

US 2007/0085347 A1 Apr. 19, 2007

(51) Int. Cl.
*E05C 19/00* (2006.01)

(52) U.S. Cl. .................... 292/304; 292/341.15

(58) Field of Classification Search ............ 292/341.16, 292/304, 57–61, 341.17, DIG. 65, 341.15; 312/215, 222, 326, 329
See application file for complete search history.

(56) References Cited

U.S. PATENT DOCUMENTS

| | | | | |
|---|---|---|---|---|
| 1,472,242 A | * | 10/1923 | Covi | 292/59 |
| 2,016,519 A | * | 10/1935 | Schmidt | 292/78 |
| 3,829,138 A | * | 8/1974 | Morita | 292/254 |
| 4,076,294 A | * | 2/1978 | Holmberg | 292/340 |
| 4,230,352 A | * | 10/1980 | Sealey et al. | 292/341.17 |
| 4,522,359 A | * | 6/1985 | Church et al. | 244/129.5 |
| 5,517,006 A | * | 5/1996 | Fredriksson et al. | 219/723 |
| 6,106,035 A | * | 8/2000 | Hetherington | 292/251 |
| 6,902,137 B2 | * | 6/2005 | Brzeski et al. | 244/129.5 |
| 7,255,376 B2 | * | 8/2007 | Pratt et al. | 292/201 |
| 2003/0122384 A1 | * | 7/2003 | Swanson et al. | 292/307 R |

* cited by examiner

*Primary Examiner*—Gary Estremsky
(74) *Attorney, Agent, or Firm*—Fletcher Yoder Law; Alexander R. Kuszewski

(57) ABSTRACT

A latch device is provided for an electrical enclosure. The latch device includes a latch plate which is movable between extended and retracted positions. In the extended position, the latch plate allows a door to be secured over an opening in the enclosure. In the retracted position, the latch plate permits unencumbered access to components and mounting structures within the enclosure, such as for removal of a mounting unit. The latching mechanism may bias the enclosure door to a closed position, while permitting movement of the door, without unlatching of the mechanism, during fault conditions within the enclosure, such as to permit the escape of hot gasses.

21 Claims, 4 Drawing Sheets

ARC RESISTANT ELECTRICAL ENCLOSURE SYSTEM AND METHOD

BACKGROUND

The present invention relates generally to the field of electrical enclosures. More particularly, the invention relates to a technique for permitting access to components within an electrical enclosure, while providing a solid latching structure to maintain a door in a closed position, even during movement of the door to permit escape of internal gasses from the enclosure.

Many applications exist in industry and other settings for electrical components disposed in controlled-environment enclosures. In industrial applications, for example, sheet metal enclosures are commonly provided in which electronic and electric power components are disposed. The enclosures may be simple box-type structures or may be more complex cabinets having a number of compartments in which the components are positioned. In currently available enclosures, for example, both power and data signals may be routed to, from and between the components within the enclosure. In many applications, larger enclosures include routing for medium or high voltage power, including three-phase power that is applied to loads by appropriate switching of the components within the enclosure.

Depending upon the size and physical configuration of enclosures, various types of latching devices may be provided that permit doors to be reliably secured in place over a component opening. The doors are typically made of the same material as the remainder of the enclosure, and are hinged to permit access to the components. In certain designs, drawers or other retractable structures may be provided for mounting the components, and for removing, at least partially, the mounted components from the enclosure for servicing. Where smaller or more tightly packed component assemblies are present in the enclosures, the access may be encumbered by the latch mechanism itself. Accordingly, there is a need for improved latching mechanisms that permit both full access to components within an electrical enclosure, yet that allow for deployment for solidly latching a door that prevents access to the components.

There is also a need in the art for improved latch mechanisms for enclosures that permit the escape of gasses during certain periods of operation. For example, certain types of faults may occur within electrical enclosures, such as due to malfunctions in wiring, components, or both. During such malfunction, gasses may be suddenly and rapidly heated by electrical discharges. The hot gasses, including gasses resulting from vaporized wiring, installation and component structures, expand rapidly and must be permitted to escape from the enclosures in controlled ways. Standards have been developed as a guide to the manner in which such hot gasses are allowed to escape from enclosures. However, latches that permit the escape of gasses during component malfunction may further encumber the access to the internal electrical components. Accordingly, there is a need for improved non-encumbering latch mechanisms that nevertheless provide for escape of hot gasses from an enclosure during faults or abnormal events that may occur within the enclosure.

BRIEF DESCRIPTION

The invention provides a novel technique for latching a component enclosure, and a corresponding enclosure structure designed to respond to such needs. The technique makes use of a latch mechanism that is movable between extended and retracted positions. The latch mechanism may be extended to secure a door in place over an enclosure opening. When retracted, the latch mechanism permits full and unencumbered access to components within the enclosure, including components mounted on slidable or otherwise removable plates or other mounting structures.

The novel latch arrangement may be configured as a subassembly of mechanical components. That is, the latch assembly may be used in various types of enclosures, and may be preassembled and simply attached to an enclosure during final assembly of the enclosure and components. The latch mechanism also permits the escape of hot gasses during malfunction of components within the enclosure. The latch mechanism is sufficiently robust to resist opening of the enclosure door during such events, while still permitting opening of the enclosure and access to the components both before and after such events.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
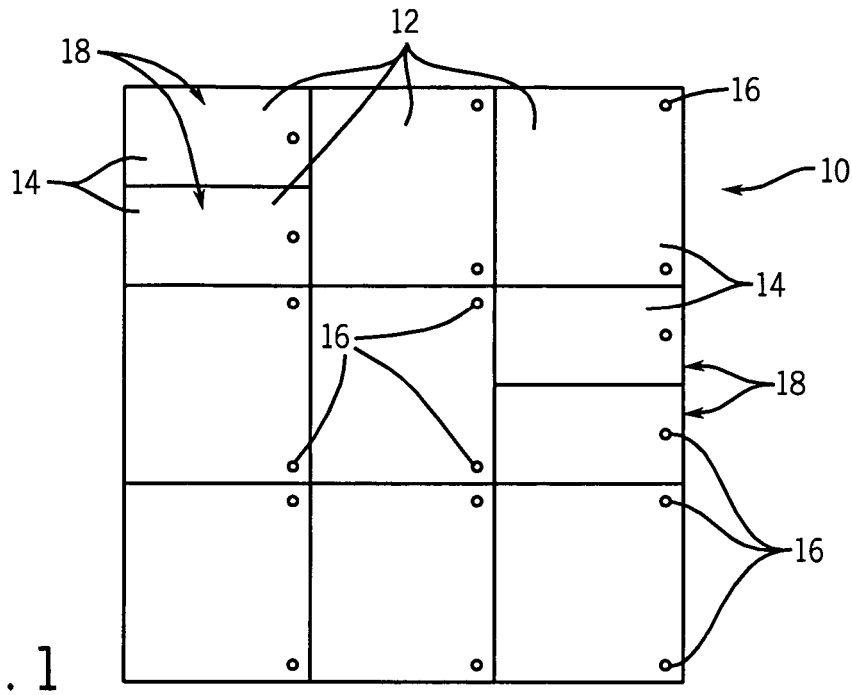
FIG. 1 is a front elevational view of an exemplary electrical enclosure having multiple compartments and corresponding doors, and employing a latch mechanism in accordance with aspects of the present technique.

Turning now to the drawings, and referring first to FIG. 1, an electrical enclosure 10 is illustrated that includes a shell made of sheet metal, such as steel, and subdivided into multiple compartments 12. The compartments 12 each have a corresponding door 14. Latches 16, described in greater detail below, can be manipulated to hold the doors securely in place over each of the compartments. The compartments will typically have a standard dimension, with several such standard dimensions typically being available in the enclosure. For example, as illustrated in FIG. 1, certain of the compartments have a larger standard dimension, while other compartments have a reduced form factor, as indicated by reference numeral 18.

While a multiple compartment enclosure is illustrated and discussed herein, it should be borne in mind that the present invention is not limited to application on such enclosures. Rather, the invention may find application on any conventional enclosure, particularly where it is desired to obtain full access to components within the enclosure both for installation and subsequent servicing. Moreover, the latch mechanisms described herein are based upon simple screws or pins that hold the doors closed over the openings in the compartments. Other latch mechanisms may include handles, toolless mechanisms, and so forth. Moreover, the enclosure latches may include locks, lockouts, and so forth.

Figure 2:
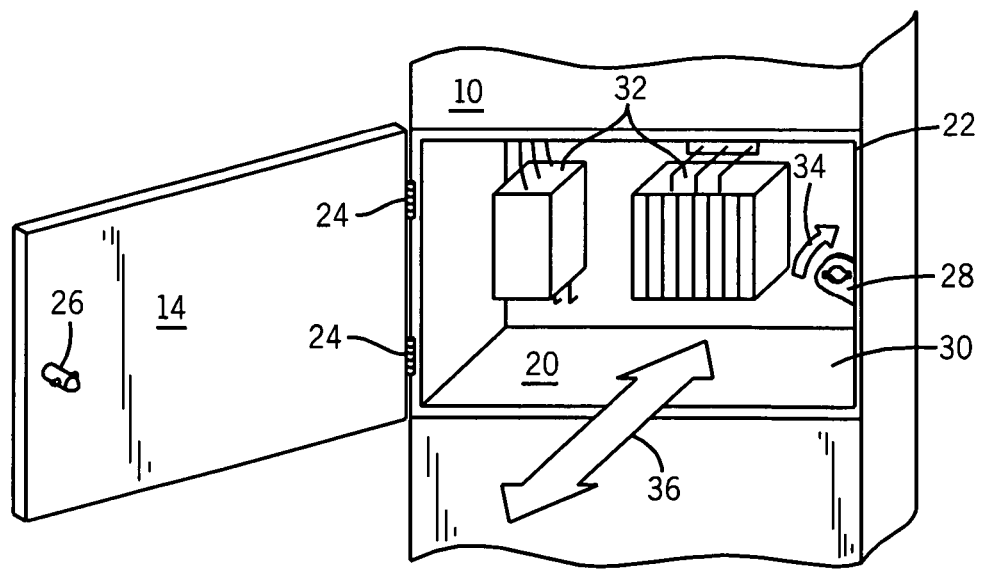
FIG. 2 is a more detailed view of one of the compartments of the enclosure of FIG. 1, illustrating certain elements of the inventive latch mechanism.

As illustrated in FIG. 2, each compartment will enclose an interior volume 20 over which the corresponding door 14 may be closed. The interior volume may be sealed by the door, or there may be some possibility of the exchange of air between the interior volume 20 and the surrounding environment (e.g., via a vent). In the illustrated embodiment, a peripheral flange 22 extends around the opening of the compartment. The flange 22 may, in certain embodiments, provide access to vertical or horizontal wire ways (not shown) through which both power and data cabling may be routed. In certain applications, the enclosure may include rear panels behind which power and data busses extend.

The enclosure door 14 is held over the opening in the compartment by hinges 24. The hinges are generally secured to the peripheral flange 22. The interior extension 26 of the latch penetrates through the door 14 and is positioned to cooperate with a moveable latch plate 28. The latch plate 28 and the associated structures from mounting the latch plate to the enclosure are described in greater detail below.

The enclosure illustrated in the figures is particularly adapted for mounting both electronic as well as electric power components, such as switch gear, industrial controllers, terminals, input/output modules, and so forth. To facilitate mounting of such components in the enclosure, a component mounting unit 30 is provided. In the illustrated embodiment, the component mounting unit 30 is adapted to be slid in and out of the enclosure in the manner of a drawer. In other embodiments, however, the component mounting unit may simply include a plate-type panel which may be positioned within the enclosure and secured in place by fasteners. Components 32 are secured on the mounting unit 30 and are electrically coupled to one another in accordance with the design of the electrical components and the system with which they are associated. As described in greater detail below, the latch mechanism, including latch plate 28, is designed such that the plate can be moved from an extended position towards a retractive position, as indicated by reference numeral 34, to provide full and unimpeded access to the components, and particularly to the component mounting unit 30. The component mounting unit 30 can thus be removed or retracted from the enclosure and replaced within enclosure freely as indicated by arrow 36.

Figure 3:
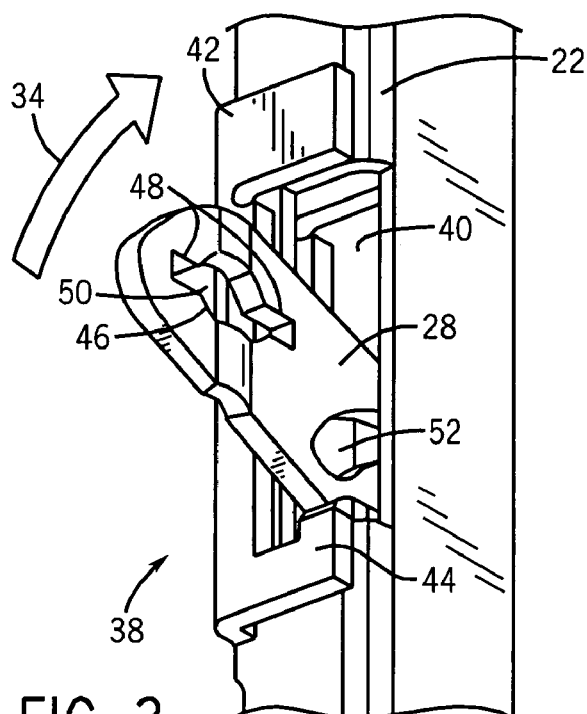
FIG. 3 is a more detailed perspective view of elements of the latch mechanism shown in FIG. 2 with a latch plate in an extended position for latching.
Figure 4:
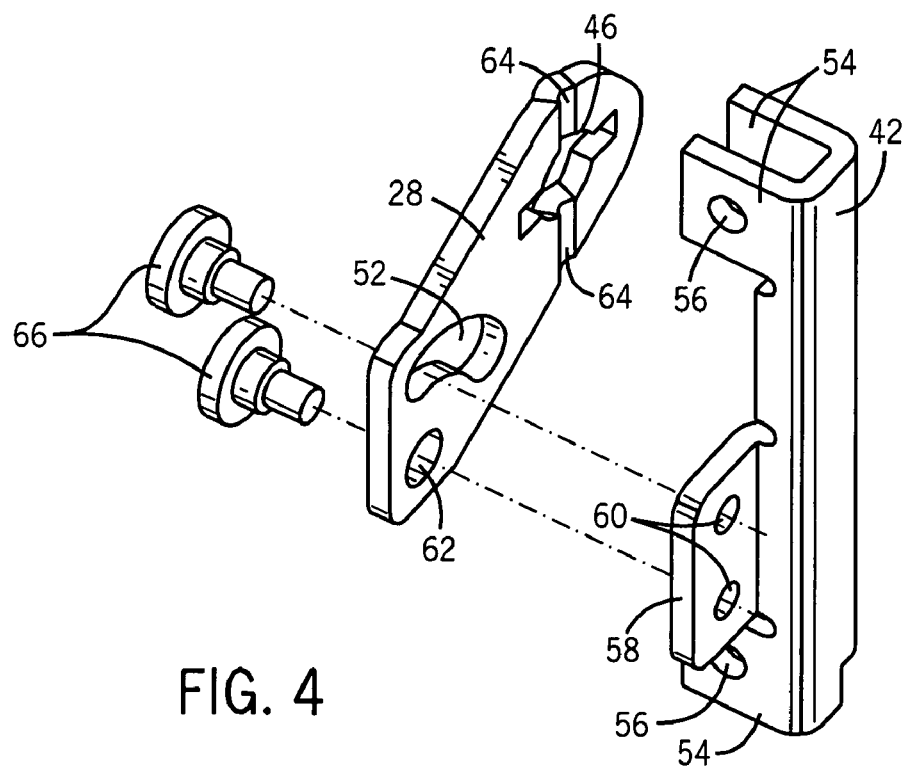
FIG. 4 is an exploded prospective view of components of an exemplary latch assembly of the type shown in FIG. 3.
Figure 5:
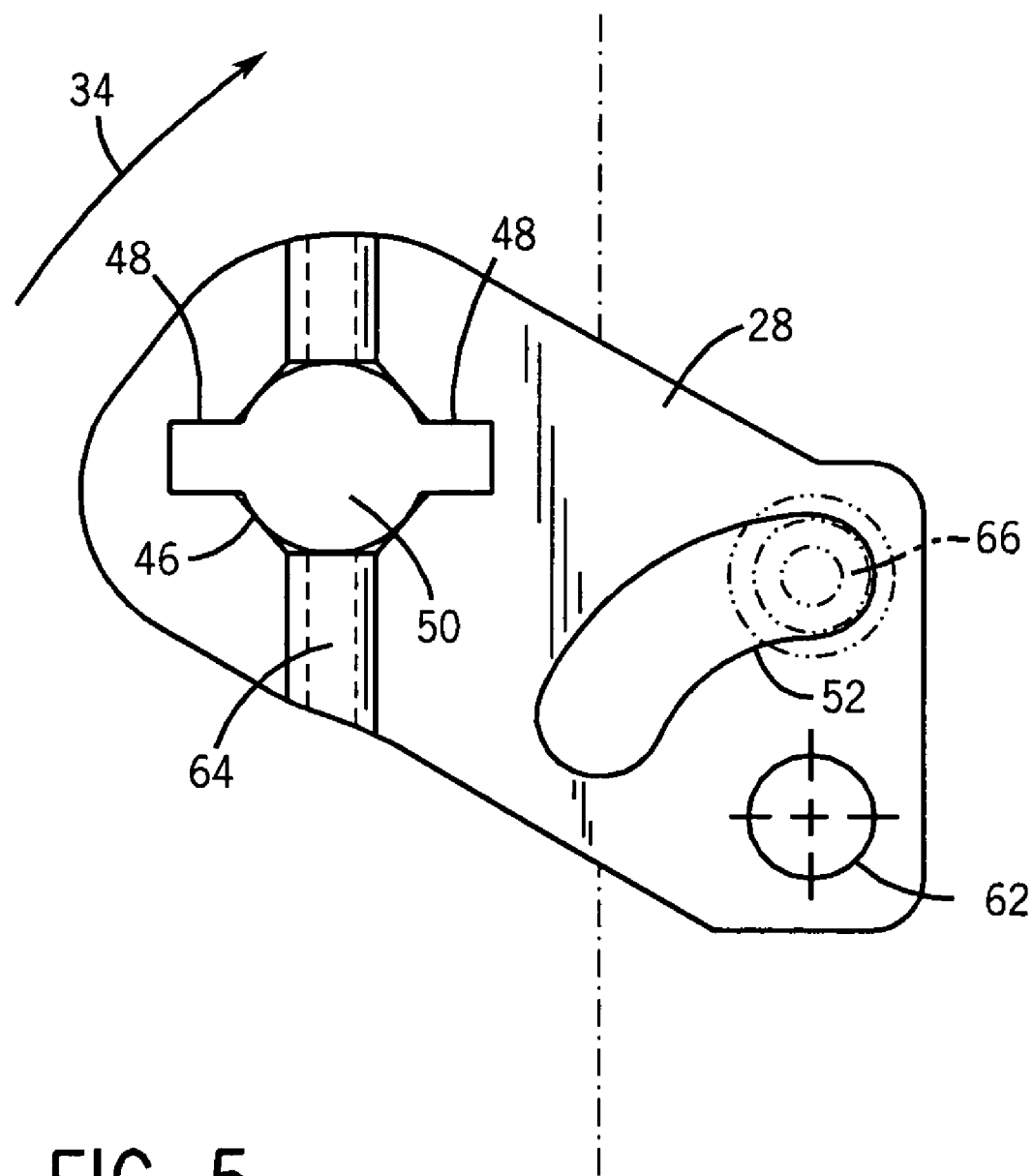
FIG. 5 is a front view of an exemplary latch plate for the mechanism shown in FIGS. 3 and 4.

Certain of the components of the latching mechanism are illustrated in greater detail in FIGS. 3, 4 and 5. As shown in FIG. 3, the latch plate assembly 38 includes latch plate 28 as well as other elements that permit the latch plate to be pivotably or rotatably mounted on the flange surrounding the opening in the enclosure. The latch plate assembly 38 is secured to the flange 22 at the location of an aperture 40 formed in the face of the flange. In the illustrated embodiment the aperture 40 is a generally rectangular aperture to which a bracket 42 is fitted. The bracket 42 may be designed in any suitable manner for solidly securing the latch plate assembly to the enclosure. In the illustrated embodiment, for example, the bracket 42 includes a hook-like extension 44 that wraps around the wall of the flange and positions the bracket appropriately over the aperture 40. These components will be described in greater detail below.

The latch plate 28 itself is rotatably mounted to the bracket 42. The latch plate 28 includes what may be referred to as a latch eye 46 that is an aperture extending through the latch plate for receiving the latch 26. The latch eye of the illustrated embodiment includes a pair of wings 48 extending from a central aperture 50. As described below, the wings accommodate lateral extensions from the rear portion of the latch, such as of a roll pin, that is used to secure the latch to the latch plate. As also illustrated in FIG. 3, an arcuate stop slot 52 is formed in the latch plate 28 to permit rotation of the latch plate between its extended and retracted positions, but to stop the latch plate at ends of this rotational travel corresponding to full unencumbered retraction of the latch plate at one extreme, and full extension of the latch plate for latching at the other extreme.

The bracket and latch plate are shown in greater detail in the exploded view of FIG. 4. As shown in FIG. 4, the bracket 42 is an elongated channel-like structure which may be stamped and bent from heavy sheet metal or plate. Securement tabs 54 extend from the bracket, and threaded holes 56 are formed in the tabs on one side of the bracket. These threaded holes 56 are configured to receive locking fasteners (not shown) that effectively clamp the securement tabs on either side of the sheet metal flange to which the bracket is attached (i.e., the sheet metal of the flange 22 discussed above). Moreover, a latch plate mounting extension 58 extends from the bracket for pivotal mounting of the latch plate 28. The latch plate mounting extension 58 has a pair of holes 60 formed therein for pivotal securement of the latch plate as discussed below.

The latch plate 28, in addition to latch eye 46 and arcuate stop slot 52, includes a pivot aperture 62. The plate itself may be formed by stamping or any similar metal forming operation, and preferably includes, in the illustrated embodiment, a pair of biasing recesses 64 on either side of the latch eye 46, preferably angularly displaced from the wings discussed above.

A pair of rivets or other fasteners 66 complete the assembly. Rivets are inserted through both the pivot aperture 62 and the arcuate stop slot 52, and through respective holes 60 in the latch plate mounting extension 58 upon assembly. Shanks or extensions of each rivet are then deformed to hold the rivet in place and the entire assembly in a unified structure. However, bearing portions of each rivet shown in FIG. 4 permit rotational movement of the latch plate about the center of pivot aperture 62. During such movement, arcuate stop slot 52 moves freely about a similar bearing surface of its rivet, but ends of the slot ultimately abut the bearing surface of the rivet to prevent further rotational movement of the latch plate beyond its fully extended and fully retracted positions.

The features of the latch plate described above are further illustrated in FIG. 5. In particular, when assembled, the latch plate is pivotable about the central axis of pivot aperture 62, as indicated by arrow 34. The arcuate slot 52, then, abuts the rivet 66 positioned therethrough to limit extension of the latch plate (to the position shown in FIG. 5) and retraction of the plate (shown in dotted lines in FIG. 5). The latch eye 46, then, presents wings 48 in a generally horizontal position when the latch plate is extended. The wings are configured to receive the latch pin, as well as a roll pin extending through the latch pin on either side of the latch pin shank. The biasing recesses 64 form a groove or channel in which the roll pin (shown in FIGS. 6 and 7) rests when the door is closed and the latch is secured. Any moment that may be developed between the extension of the latch plate and the location of the rivets that extend through the arcuate slot 52 and the pivot aperture 62 (e.g., due to pressure on the door during an arc fault) is resisted by the material of the latch plate itself. The latch plate, during fault conditions within the enclosure, therefore is preferably loaded both in bending and in sheer, but particularly in sheer to allow for the latch plate and latch plate assembly to resist pressures on the door during fault events. It should also be noted that the roll pin is loaded in double shear, rather than in bending as a cantilevered beam.

Figure 6:
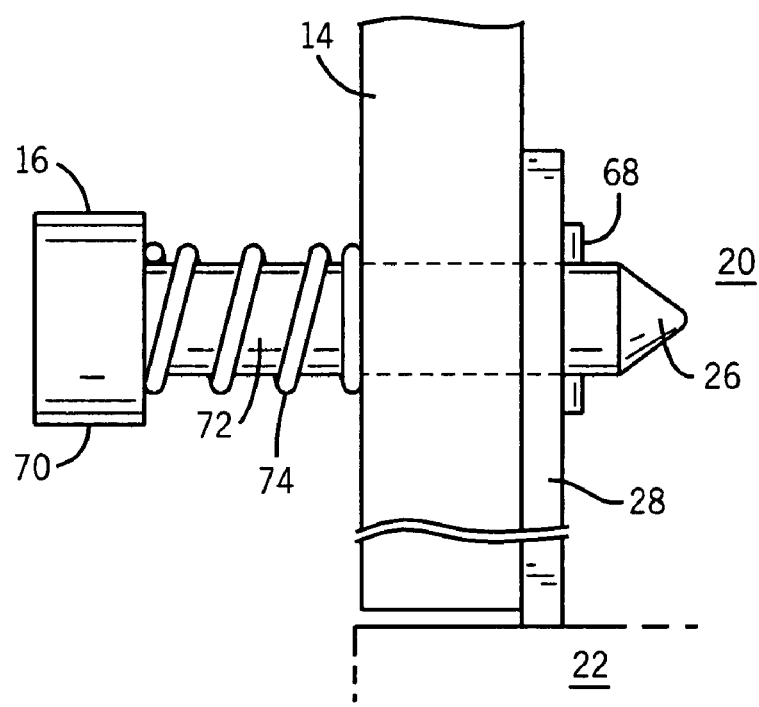
FIGS. 6 and 7 are side elevational views of the foregoing latch arrangement shown both before and during a malfunction within the enclosure that causes movement of the enclosure door for the escape of gasses.
Figure 7:
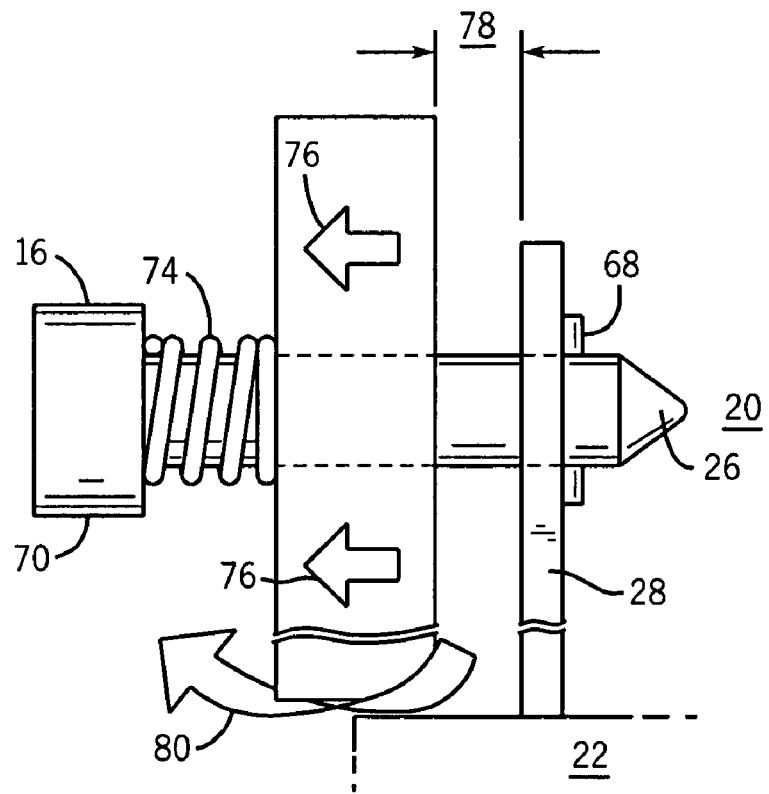

FIGS. 6 and 7 illustrate the foregoing components in cooperation when the door of the enclosure is closed and latched. As shown in FIG. 6, the latch pin 26 extends through the door 14 and through latch plate 28, which in this position extends from the flange 22. The latch pin presents a roll pin or similar extension 68 that comes to rest within the biasing recesses 64 (not shown in FIG. 6) of the latch plate. The latch itself includes a head 70 and a shank 72. A biasing spring 74 is provided between the head 70 and the outer surface of the enclosure door 14. In the illustrated embodiment, the biasing spring is a compression spring that forces the door closed while maintaining the roll pin 68 in tight engagement behind the latch plate 28. The entire structure is thus secured by insertion of the latch pin and roll pin through the latch eye 46 (see FIGS. 2, 3, 4 and 5) and rotation of the latch pin to cause the roll pin 68 to enter into the biasing recesses 64 (see FIGS. 4 and 5).

During a fault condition within the enclosure, hot gasses may be produced within the interior volume 20. As shown in FIG. 7, the latch mechanism permits the door to be displaced as indicated by arrows 76 by compressing spring 74 between the head 70 of the latch pin and the exterior surface of the door. The latch plate 28 and associated structures resist such movement and the forces resulting from the pressure of the hot gasses on the interior surface of the door. The door may be displaced by a distance 78 that permits gasses to escape from the interior of the enclosure, as indicated by arrow 80 in FIG. 7. In a present embodiment, the escaping gasses are at least partially diverted and/or cooled so that the enclosure conforms to the guidelines of current arc fault or arc flash testing as set forth in, for example, ANSI standard 37.20.7. Following such venting of gasses by displacement of the door, the door may be returned to its original position by extension of the spring 74. It might also be noted that the provision of a spring arrangement on the latch enables problems with proper closure or latching to be easily seen. In such situations, the latch pin may simply hang or appear misaligned.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electrical enclosure system comprising:
   an electrical enclosure configured to receive and house electrical components, the electrical enclosure having an opening for accessing the electrical components;
   a door attached to the electrical enclosure for covering the opening and enclosing an interior volume of the electrical enclosure;
   a latch plate mounted to the electrical enclosure adjacent to the opening, wherein the latch plate moves in and out of the opening between an extended position in which the latch plate extends over a side of the opening and a retracted position in which the latch plate permits substantially unimpeded access to the components, and wherein the latch plate is configured to move in a first plane parallel to a second plane of the door in a closed position of the door over the opening; and
   a latch mounted to the door and cooperative with the latch plate when the latch plate is in the extended position to hold the door closed over the opening, wherein the latch includes a latch pin and a biasing member cooperative with the latch pin to hold the door closed over the opening, wherein the biasing member deforms in response to a pressure differential to permit movement of the door for escape of gases from the interior volume due to an electrical fault within the enclosure.

2. The system of claim 1, wherein the latch plate is pivotably secured to the electrical enclosure, and is pivotable in the first plane between the extended and retracted positions.

3. The system of claim 1, wherein the latch pin is rotatable to secure the latch pin to the latch plate, and wherein the biasing member is a spring disposed around the latch pin and compressed between a head of the latch pin and a front surface of the door.

4. The system of claim 1, comprising a component mounting unit movable into and out of the interior volume, and wherein in the retracted position the latch plate is withdrawn along the first plane away from the opening sufficiently to permit passage of the component mounting unit through the enclosure opening.

5. An electrical enclosure system comprising:
   an electrical enclosure configured to receive and house electrical components, the electrical enclosure having an opening for accessing the components;
   a door attached to the electrical enclosure for covering the opening and enclosing an interior volume of the electrical enclosure;
   a movable latch plate mounted to the electrical enclosure adjacent to the opening; and
   a latch pin biased by a biasing member to hold the door closed over the opening, wherein the biasing member deforms in response to a pressure differential to permit movement of the door for escape of gases from the interior volume due to an electrical fault within the enclosure, wherein the latch pin is rotatable to secure the latch pin to the latch plate, and wherein the biasing member is a spring disposed around the latch pin and compressed between a head of the latch pin and a front surface of the door.

6. The system of claim 5, wherein the latch plate is pivotably secured to the electrical enclosure, and is pivotable in a first plane between the extended and retracted positions, and the first plane is parallel to a second plane of the door in a closed position of the door over the opening.

7. The system of claim 5, wherein the latch plate is part of an assembly including a mounting bracket and the latch plate, the latch plate being pivotally mounted to the mounting bracket, the mounting bracket being configured for mounting to the electrical enclosure adjacent to the opening in the electrical enclosure such that the latch plate is movable from an extended position in which the latch plate extends over a side of the opening and a retracted position in which the latch plate permits substantially unimpeded access to components within the electrical enclosure.

8. An electrical enclosure system comprising:
   an electrical enclosure configured to receive and house electrical components, the electrical enclosure having an opening for accessing the electrical components;
   a door attached to the electrical enclosure for covering the opening and enclosing an interior volume of the electrical enclosure;
   a latch plate mounted to the electrical enclosure adjacent to the opening, wherein the latch plate moves in and out of the opening between an extended position in which the latch plate extends over a side of the opening and a retracted position in which the latch plate permits substantially unimpeded access to the components, and wherein the latch plate is configured to move in a first plane parallel to a second plane of the door in a closed position of the door over the opening; and a latch mounted to the door and cooperative with the latch plate when the latch plate is in the extended position to hold the door closed over the opening;

wherein the latch plate and latch are cooperative to permit movement of the door for escape of gases due a pressure increase in the interior volume caused by an electrical fault within the enclosure;

wherein the latch includes a latch pin and a biasing member cooperative with the latch pin to hold the door closed over the opening, the biasing member being deformable to permit movement of the door for escape of gases from the interior volume due to an electrical fault within the enclosure;

wherein the latch pin is rotatable to secure the latch pin to the latch plate, and wherein the biasing member is a spring disposed around the latch pin and compressed between a head of the latch pin and a front surface of the door.

9. The system of claim 8, comprising a component mounting unit movable into and out of the interior volume, and wherein in the retracted position the latch plate is withdrawn along the first plane away from the opening sufficiently to permit passage of the component mounting unit through the enclosure opening.

10. The system of claim 8, wherein the latch plate is pivotably secured to the electrical enclosure, and is pivotable in the first plane between the extended and retracted positions.

11. The system of claim 10, comprising:
a bracket for mounting the latch plate to the electrical enclosure; and
a rotating pin for pivotally securing the latch plate to the bracket.

12. The system of claim 11, wherein the latch plate includes an arcuate slot, and the system includes a rotation limiting pin extending from the bracket and into the arcuate slot to limit rotation of the latch plate in the first plane between the extended and retracted positions.

13. An electrical enclosure system comprising:
a latch plate assembly including a mounting bracket and a latch plate, the latch plate being pivotally mounted to the mounting bracket, the mounting bracket being configured for mounting to an electrical enclosure adjacent to an opening in the electrical enclosure such that the latch plate moves in and out of the opening between an extended position in which the latch plate extends over a side of the opening and a retracted position in which the latch plate permits substantially unimpeded access to components within the electrical enclosure,
wherein the latch plate assembly includes a rotating pin for pivotally securing the latch plate to the mounting bracket, wherein the latch plate includes an arcuate slot, and the latch plate assembly includes a rotation limiting pin extending from the mounting bracket and into the arcuate slot to limit rotation of the latch plate between the extended and retracted positions.

14. The system of claim 13, wherein the latch plate includes an aperture for receiving a latch pin to hold a door of the electrical enclosure in a closed position.

15. The system of claim 13, wherein the arcuate slot comprises an arcuate path extending along a plane, the rotation limiting pin follows the arcuate path to pivot the latch plate in the plane, and the plane is configured to extend across the opening into the electrical enclosure.

16. An electrical enclosure system, comprising:
a latch assembly, comprising:
a latch plate comprising a pivot joint and a latch receptacle at opposite first and second end portions of the latch plate, wherein the latch plate is configured to rotate about the pivot joint along a plane across an opening of an electrical enclosure; and
a latch pin comprising a shank and a catch, wherein the latch pin is configured to move perpendicular to the plane in and out of the latch receptacle, and the catch is configured to secure and release the latch pin with the latch receptacle.

17. The electrical enclosure system of claim 16, wherein the latch receptacle comprises an elongated slot extending along the latch plate, the catch comprises an extension extending perpendicular to a longitudinal axis of the shank, and the latch pin is configured to rotate about the longitudinal axis to position the extension into and out of alignment with the elongated slot in the latch plate.

18. The electrical enclosure system of claim 16, comprising a spring disposed about the shank between a head and the catch of the latch pin, wherein the spring is configured to release a door disposed across the opening in response to a pressure increase within the electrical enclosure.

19. The electrical enclosure system of claim 18, comprising the door disposed between the spring and the catch.

20. The electrical enclosure system of claim 19, comprising the electrical enclosure, wherein the door is hingedly coupled to a first side of the opening of the electrical enclosure, the latch plate is pivotally coupled to a second side of the opening of the electrical enclosure, the first and second sides are opposite from one another, the door rotates open away from the plane of the opening, the door rotates closed toward the plane of the opening to a closed position parallel to the plane of the opening, the latch plate pivots along the plane parallel to the door when the door is in the closed position, and the latch pin moves perpendiculate to the door, the plane, and the plate when the door is in the closed position.

21. An electrical enclosure system comprising:
an electrical enclosure configured to receive and house electrical components, the electrical enclosure having an opening for accessing the electrical components;
a door attached to the electrical enclosures for covering the opening and enclosing an interior volume of the electrical enclosure;
a latch plate mounted to the electrical enclosure adjacent to the opening, wherein the latch plate moves in and out of the opening between an extended position in which the latch plate extends over a side of the opening and a retracted position in which the latch plate permits substantially unimpeded access to the components, and wherein the latch plate is configured to move in a first plane parallel to a second plane of the door in a closed position of the door over the opening;
a bracket for mounting the latch plate to the electrical enclosure;
a rotating pin for pivotally securing the latch plate to the bracket; and
a latch mounted to the door and cooperative with the latch plate when the latch plate is in the extended position to hold the door closed over the opening;
wherein the latch plate and latch are cooperative to permit movement of the door for escape of gases due a pressure increase in the interior volume caused by an electrical fault within the enclosure, the latch plate is pivotably secured to the electrical enclosure, and the latch plate is pivotable in the first plane between the extended and retracted positions.

* * * * *